United States Patent
Oguma et al.

(10) Patent No.: US 11,538,983 B2
(45) Date of Patent: Dec. 27, 2022

(54) CHIP COMPONENT MANUFACTURING METHOD

(71) Applicants: NGK Insulators, Ltd., Nagoya (JP); NGK Ceramic Device Co., Ltd., Komaki (JP)

(72) Inventors: Isamu Oguma, Nagoya (JP); Takatomo Ogata, Nagoya (JP); Shigeru Funabashi, Komaki (JP); Hidetake Ota, Komaki (JP)

(73) Assignees: NGK Insulators, Ltd., Nagoya (JP); NGK Ceramic Device Co., Ltd., Komaki (JP)

( * ) Notice: Subject to any disclaimer, the term of this patent is extended or adjusted under 35 U.S.C. 154(b) by 169 days.

(21) Appl. No.: 16/812,742

(22) Filed: Mar. 9, 2020

(65) Prior Publication Data
US 2020/0212289 A1 Jul. 2, 2020

Related U.S. Application Data

(63) Continuation of application No. PCT/JP2018/033487, filed on Sep. 10, 2018.

(30) Foreign Application Priority Data

Sep. 12, 2017 (JP) .............................. JP2017-174835

(51) Int. Cl.
*H01L 41/338* (2013.01)
*H01L 21/683* (2006.01)

(52) U.S. Cl.
CPC ........ *H01L 41/338* (2013.01); *H01L 21/6836* (2013.01)

(58) Field of Classification Search
CPC . H01L 41/338; H01L 21/683; H01L 21/6836; H01L 2221/68327; H01G 4/30
See application file for complete search history.

(56) References Cited

U.S. PATENT DOCUMENTS 7,384,811 B2 * 6/2008 Miyamoto ........ H01L 21/67132
438/33
7,531,432 B2 * 5/2009 Arshad ............. H01L 21/67115
438/464

(Continued)

FOREIGN PATENT DOCUMENTS

EP 0942054 A1 * 9/1999 ................ C09J 5/00
EP 2757606 A1 * 7/2014 ........... H01L 41/331

(Continued)

OTHER PUBLICATIONS

International Search Report and Written Opinion (Application No. PCT/JP2018/033487) dated Nov. 13, 2018.

(Continued)

*Primary Examiner* — Jeffrey T Carley
(74) *Attorney, Agent, or Firm* — Burr & Brown, PLLC (57) ABSTRACT

Provided is a chip component manufacturing method which enables a plurality of chip pieces to be handled while being pasted to a sheet, and in which it is possible to apply at least a surface treatment to a plurality of chip pieces while being pasted to a sheet. This chip component manufacturing method comprises: a step for retaining a green sheet or the like on a carrier sheet; a step for cutting, together with a portion of the carrier sheet, the green sheet or the like retained on the carrier sheet; a step for removing, together with a portion of the carrier sheet, at least a dummy portion of the green sheet or the like that has been cut, so as to leave a plurality of chip pieces on the carrier sheet; and a step for applying at least a surface treatment to lateral surface portions of the plurality of chip pieces that have become exposed due to the removing while the plurality of chip pieces are being retained on the carrier sheet.

11 Claims, 7 Drawing Sheets

(56) References Cited

U.S. PATENT DOCUMENTS

| | | | | |
|---|---|---|---|---|
| 2004/0070328 A1* | 4/2004 | Van den Bergh | ....... | B32B 15/08 |
| | | | | 313/461 |
| 2004/0226647 A1* | 11/2004 | Ito | ......................... | C04B 35/645 |
| | | | | 156/89.12 |
| 2005/0082651 A1* | 4/2005 | Farnworth | .......... | H01L 23/3185 |
| | | | | 257/E21.599 |
| 2009/0229860 A1* | 9/2009 | Shin | ..................... | H05K 3/0052 |
| | | | | 174/250 |
| 2010/0300602 A1* | 12/2010 | Ichiyanagi | .............. | H01L 28/40 |
| | | | | 156/89.12 |
| 2011/0090656 A1* | 4/2011 | Hamatani | ............ | H05K 3/4007 |
| | | | | 361/761 |
| 2013/0009316 A1* | 1/2013 | Wang | .................. | H01L 21/6835 |
| | | | | 257/774 |
| 2013/0328071 A1* | 12/2013 | Tanaka | ................ | H01L 27/3244 |
| | | | | 257/88 |
| 2018/0240593 A1* | 8/2018 | Takagi | ................... | H01G 4/012 |

FOREIGN PATENT DOCUMENTS

| | | | | | |
|---|---|---|---|---|---|
| JP | 2001002475 | A | * | 1/2001 | ....... H01L 23/49894 |
| JP | 2002175955 | A | * | 6/2002 | |
| JP | 5556070 | B2 | | 7/2014 | |

OTHER PUBLICATIONS

English translation of the International Preliminary Report on Patentability (Chapter I)(Application No. PCT/JP2018/033487) dated Mar. 17, 2020.

\* cited by examiner

[TABLE 1]

| | HANDLING | ALIGNMENT OF CHIP PIECES | CARRIER SHEET | | | | PERCENT DEFECTIVE (%) |
| --- | --- | --- | --- | --- | --- | --- | --- |
| | | | FIRST ADHESIVE LAYER | | SECOND ADHESIVE LAYER | | |
| | | | ADHESIVE STRENGTH (N/25mm) | THICKNESS ($\mu m$) | ADHESIVE STRENGTH (N/25mm) | THICKNESS ($\mu m$) | |
| EXAMPLE 1 | GOOD | UNNEEDED | 0.1 | 10 | 0.4 | 40 | 4.20 |
| EXAMPLE 2 | GOOD | UNNEEDED | 0.1 | 10 | 1.2 | 40 | 0.93 |
| EXAMPLE 3 | GOOD | UNNEEDED | 0.1 | 10 | 5.9 | 40 | 0.63 |
| EXAMPLE 4 | GOOD | UNNEEDED | 0.1 | 10 | 5.9 | 30 | 0.42 |
| EXAMPLE 5 | GOOD | UNNEEDED | 0.1 | 10 | 5.9 | 20 | 0.27 |
| EXAMPLE 6 | GOOD | UNNEEDED | 0.05 | 10 | 5.9 | 10 | 0.06 |
| EXAMPLE 7 | GOOD | UNNEEDED | 0.1 | 10 | 5.9 | 10 | 0.31 |
| COMPARATIVE EXAMPLE | POOR | NEEDED | | | | | 35.0 |

CHIP COMPONENT MANUFACTURING METHOD

CROSS-REFERENCE TO RELATED APPLICATIONS

This application is a Continuation of International Application No. PCT/JP2018/033487 filed on Sep. 10, 2018, which is based upon and claims the benefit of priority from Japanese Patent Application No. 2017-174835 filed on Sep. 12, 2017, the contents all of which are incorporated herein by reference.

BACKGROUND OF THE INVENTION

1. Field of the Invention

The present invention relates to chip component manufacturing methods, and to a chip component manufacturing method that can be suitably applied to a method for manufacturing ceramic chip components such as piezoelectric elements, for example.

2. Description of Related Art

Conventional chip component manufacturing methods include the manufacturing method described in Japanese Patent No. 5556070, for example. This manufacturing method includes: the process of sticking on a semiconductor wafer a single layer of adhesive sheet combined with a dicing tape, which includes a laminate of: an adhesive sheet; and a dicing tape whose adhesive strength decreases with energy ray irradiation; and the process of cutting the semiconductor wafer and the adhesive sheet to dice the semiconductor wafer into pieces, so as to produce a plurality of semiconductor chips.

SUMMARY OF THE INVENTION

The semiconductor chips obtained by dicing the semiconductor wafer into pieces have already undergone ion implantation process, wiring process, electrode formation process, etc. and have been completed as semiconductor chips by being diced into pieces.

In contrast, in the case of chip components, a ceramic green sheet or ceramic laminate is diced into a plurality of chip pieces and then the chip pieces have to be put in a process of at least surface treatment for forming electrodes etc. on side surfaces of the chip pieces. The chip pieces are very small and are large in number, and therefore they are difficult to handle and positioning the chip pieces for the surface treatment is also difficult.

The present invention has been devised considering such problems and an object of the present invention is to provide a method of manufacturing chip components that offers the following effects:

(a) a plurality of chip pieces can be handled while being stuck on a sheet and can be brought into the next process easily; and (b) the plurality of chip pieces can be subjected to at least surface treatment while being stuck on the sheet.

[1] A chip component manufacturing method according to the present invention includes the steps of: holding a ceramic green sheet or green laminate on a carrier sheet; cutting the green sheet or green laminate held on the carrier sheet together with part of the carrier sheet; removing part of the green sheet or green laminate, after having been cut, that is not used as at least a product, together with part of the carrier sheet, and leaving a plurality of chip pieces on the carrier sheet; and with the plurality of chip pieces being held on the carrier sheet, applying at least a surface treatment to side surface portions of the plurality of chip pieces that have been exposed by the removal.

According to this method, the plurality of chip pieces can be handled in the state of being stuck on the carrier sheet and can be put into the next process easily. Furthermore, the plurality of chip pieces can be subjected to at least a surface treatment while being stuck on the carrier sheet. Accordingly, a plurality of chip components can be manufactured easily by removing the surface-treated chip pieces (chip components) from the sheet.

[2] In the present invention, the chip component manufacturing method may further include the steps of: holding the plurality of chip pieces on a new carrier sheet and then removing the plurality of chip pieces from the carrier sheet on which the plurality of chip pieces were stuck originally; cutting the chip pieces held on the new carrier sheet together with part of the carrier sheet; removing parts of the chip pieces, after having been cut, that are not used as at least products, together with part of the carrier sheet, and leaving a plurality of chip pieces on the carrier sheet; and with the plurality of chip pieces being held on the new carrier sheet, applying at least a surface treatment to other side surface portions of the plurality of chip pieces that have been exposed by the removal. It is thus possible to form a large number of complicatedly configured chip pieces and to form electrode films on multiple side surfaces of each chip.

[3] In the present invention, preferably, the carrier sheet has a laminated structure including two or more sheets each having a base layer and an adhesive layer formed on one surface of the base layer.

With this structure, when removing the part of the green sheet or green laminate, after having been cut, that is not used as products, the part of the first-layer (upper-layer) sheet of the carrier sheet that corresponds to the part not used as products is also removed. As a result, a recess having side walls along the side surfaces of the chip pieces is formed in the first-layer sheet.

This facilitates the following surface treatment to the side surface portions of the chip pieces and also enables the surface treatment to be performed with the chip pieces being stuck on the sheet.

[4] In the present invention, preferably, the adhesive layer of the carrier sheet has an adhesive strength that varies with temperature change or ultraviolet irradiation.

Because the adhesive strength of the adhesive layer of the carrier sheet is decreased by temperature change or ultraviolet irradiation, the part not used as products can be easily removed from the carrier sheet together with part of the carrier sheet, leaving a plurality of chip pieces on the carrier sheet.

[5] In the present invention, each of the adhesive layers may have an adhesive strength that is set arbitrarily, and the adhesive strengths of the individual layers may be same or different.

[6] In the present invention, the carrier sheet may include a laminate of a first sheet and a second sheet, the first sheet may include a first base layer and a first adhesive layer on which the green sheet or green laminate is stuck, and the second sheet may include a second base layer and a second adhesive layer on which the first sheet is stuck.

[7] In the present invention, preferably, the first adhesive layer has a lower adhesive strength than the second adhesive layer.

[8] In the present invention, the second adhesive layer has an adhesive strength that is equal to or greater than preferably four times or more preferably 12 times the adhesive strength of the first adhesive layer.

[9] In the present invention, preferably, the first adhesive layer has a thickness which is smaller than that of the second adhesive layer.

[10] In the present invention, preferably, the first adhesive layer has an adhesive strength equal to or greater than 0.05 N/25 mm and a thickness equal to or less than 10 μm.

[11] In the present invention, the second adhesive layer preferably has an adhesive strength equal to or greater than 0.4 N/25 mm and a thickness equal to or less than 40 μm, more preferably an adhesive strength equal to or greater than 5.9 N/25 mm and a thickness equal to or less than 40 μm, and still more preferably an adhesive strength equal to or greater than 5.9 N/25 mm and a thickness equal to or less than 10 μm.

The chip component manufacturing method according to the present invention offers the following effects:

(a) a plurality of chip pieces can be handled while being stuck on a sheet and can be brought into the next process easily; and (b) the plurality of chip pieces can be subjected to at least surface treatment in the state being stuck on the sheet.

DETAILED DESCRIPTION OF THE INVENTION

Embodiments of the chip component manufacturing method of the present invention will now be described referring to FIGS. 1 to 7. In this specification, the word "to" indicating a numerical range is used to mean that the range includes the preceding and following numerical values as its lower and upper limit values.

Though not shown graphically, chip components of this embodiment are obtained by dicing one layer of ceramic green sheet into a plurality of chip pieces and then forming electrodes etc. on side surfaces of the chip pieces, for example. Alternatively, chip components are obtained by dicing a ceramic laminate, including multiple ceramic green sheets and multiple internal electrodes laminated on one another, into a plurality of chip pieces and then forming electrodes etc. on side surfaces of the plurality of chip pieces, for example. The ceramic green sheet above may have internal electrodes or external electrodes formed therein or thereon. Subsequently, the chip components are sintered and manufactured as products such as piezoelectric elements, resonators, filters, and the like. The chip components are, for example, cuboid-shaped and have a length of 0.2 to 0.4 mm, a width of 0.8 to 1.2 mm, and a thickness of 0.05 to 0.2 mm.

Figure 1:
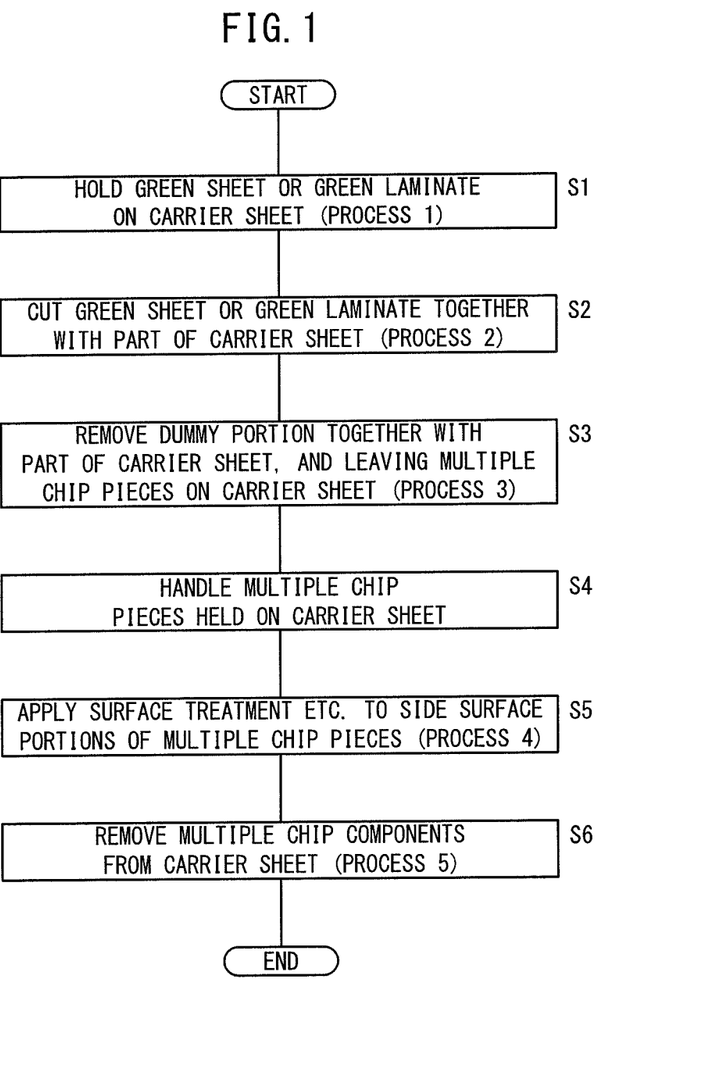
FIG. 1 is a flowchart showing a chip component manufacturing method according to a first embodiment (a first manufacturing method.

As shown in FIG. 1, a method for manufacturing chip components according to a first embodiment (hereinafter referred to as a first manufacturing method) includes a process 1, process 2, process 3, process 4, and process 5.

Figure 2A:
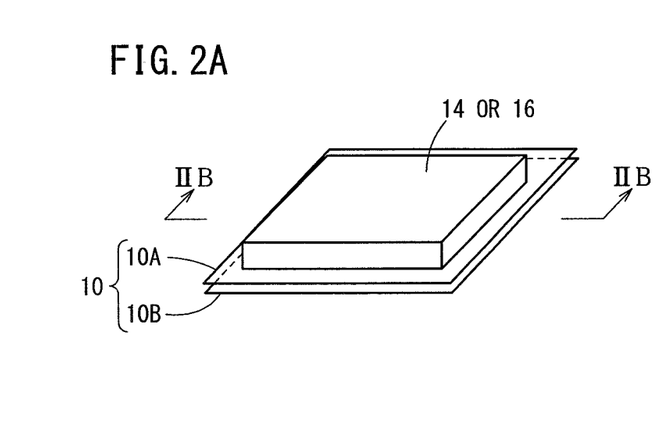
FIG. 2A is a perspective view illustrating a ceramic green sheet or green laminate held on a carrier sheet in the first manufacturing method.
Figure 2B:
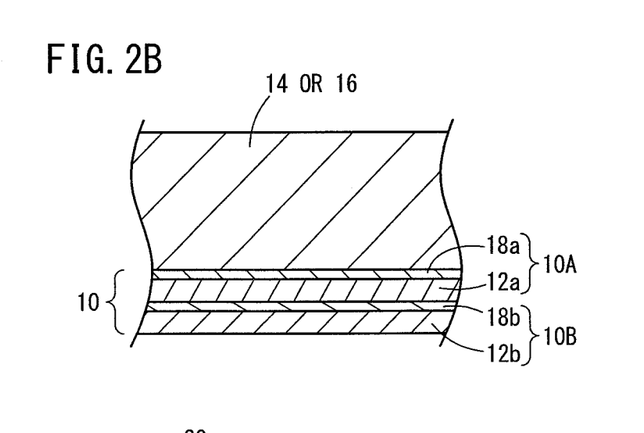
FIG. 2B is the cross section taken along line IIB-IIB in FIG. 2A.

In the process 1, or in step S1 of FIG. 1, as shown in FIGS. 2A and 2B, a ceramic green sheet 14 or green laminate 16 is held on a carrier sheet 10. The carrier sheet 10 includes two or more layers of sheets each composed of a base layer and an adhesive layer formed on one surface of the base layer.

In the first manufacturing method, as shown in FIG. 2B, the carrier sheet 10 includes a first sheet 10A and a second sheet 10B laminated on each other. The first sheet 10A includes a first base layer 12*a* and a first adhesive layer 18*a* on which the green sheet 14 or green laminate 16 is stuck. The second sheet 10B includes a second base layer 12*b* and a second adhesive layer 18*b* on which the first sheet 10A is stuck.

In this process 1 (sticking process), the green sheet 14 or green laminate 16 is stuck on the upper surface of the first sheet 10A of the carrier sheet 10 (on the upper surface of the first adhesive layer 18*a*).

Figure 2C:
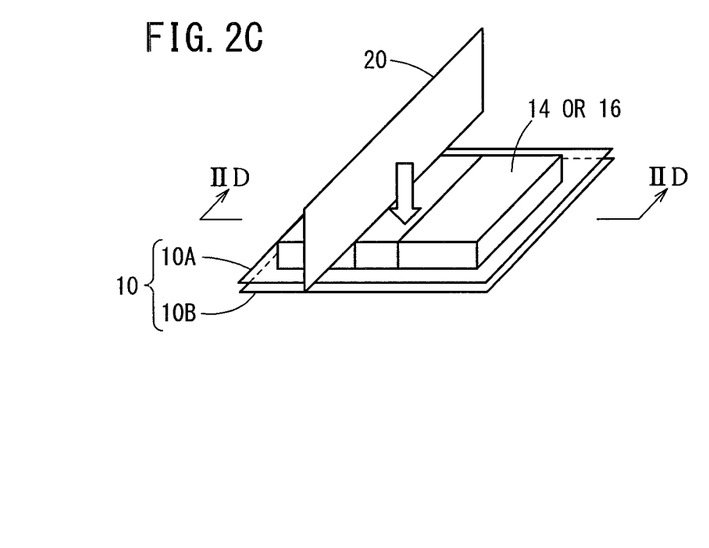
FIG. 2C is a perspective view illustrating a situation where the green sheet or green laminate held on the carrier sheet is cut together with part of the carrier sheet.
Figure 2D:
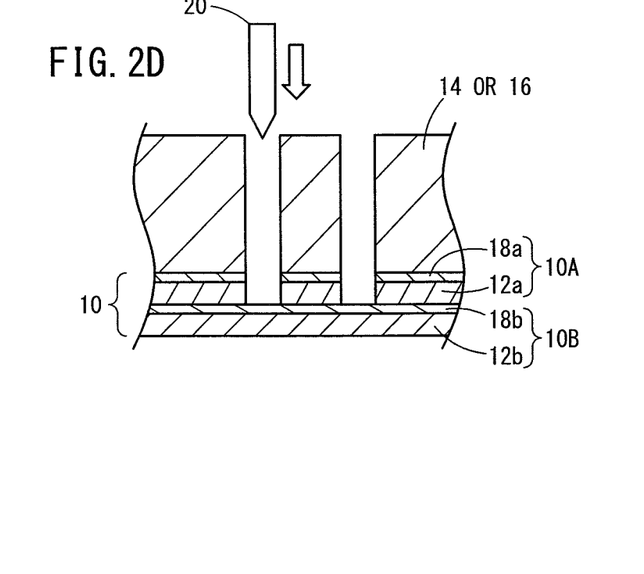
FIG. 2D is the cross section taken along line IID-IID in FIG. 2C.

Next, in the process 2 (cutting process), in step S2 of FIG. 1, the green sheet 14 or green laminate 16 held on the carrier sheet 10 is cut together with part of the carrier sheet 10. More specifically, as shown in FIGS. 2C and 2D, a knife 20, as a cutting means, is moved to a position where its blade reaches the second adhesive layer 18*b* of the second sheet 10B, so as to cut the green sheet 14 or green laminate 16 and the first sheet 10A. The green sheet 14 or green laminate 16 is cut at borders between part of the green sheet 14 or green laminate 16 that is to be used as products and its part that is not to be used as products. In this case, since what is required is to cut the green sheet 14 or green laminate 16 and the first sheet 10A, the position of the blade may reach halfway in the first base layer 12*a* of the first sheet 10A, halfway in the second adhesive layer 18*b* of the second sheet 10B, or halfway in the second base layer 12*b* of the second sheet 10B.

Figure 3A:
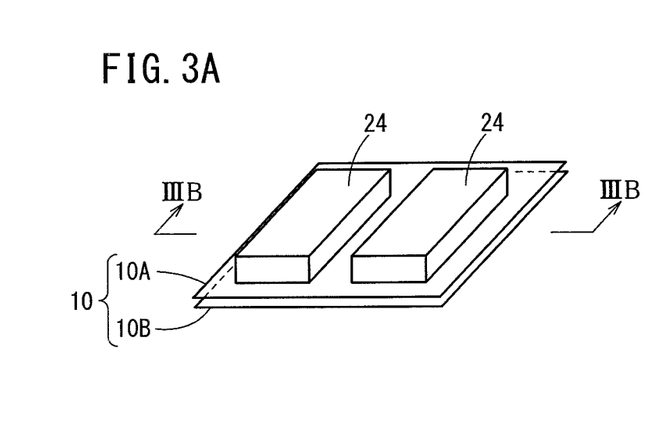
FIG. 3A is a perspective view illustrating a situation where, in the first manufacturing method, a dummy portion of the cut green sheet or green laminate has been removed together with part of the carrier sheet, leaving a plurality of chip pieces on the carrier sheet.
Figure 3B:
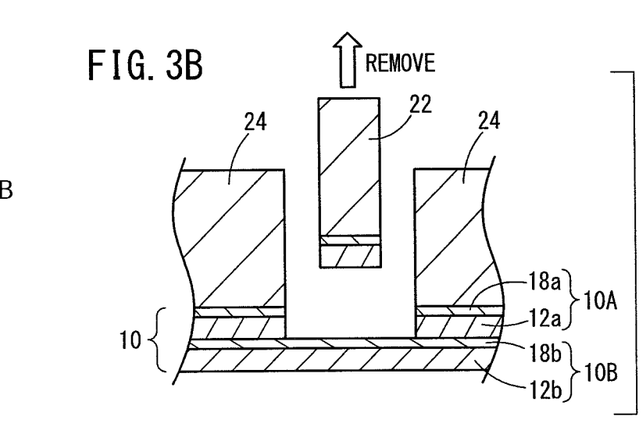
FIG. 3B is the cross section taken along line IIIB-IIIB in FIG. 3A, where the dummy portion is being removed together with part of the carrier sheet.

Next, in the process 3 (dummy portion removal process), in step S3 of FIG. 1, as shown in FIGS. 3A and 3B, part of the green sheet 14 or green laminate 16, after having been cut, that is at least not used as products (hereinafter referred to as dummy portion 22 (see FIG. 3B)) is removed together with part of the carrier sheet 10, leaving a plurality of chip pieces 24 on the carrier sheet 10. At this time, the part of the first sheet 10A, after having been cut, that underlies the dummy portion 22, is also removed together with the dummy portion 22.

Subsequently, in step S4, the plurality of chip pieces 24 are handled while being kept on the carrier sheet 10, to be put into the next process (side surface treatment process).

Figure 3C:
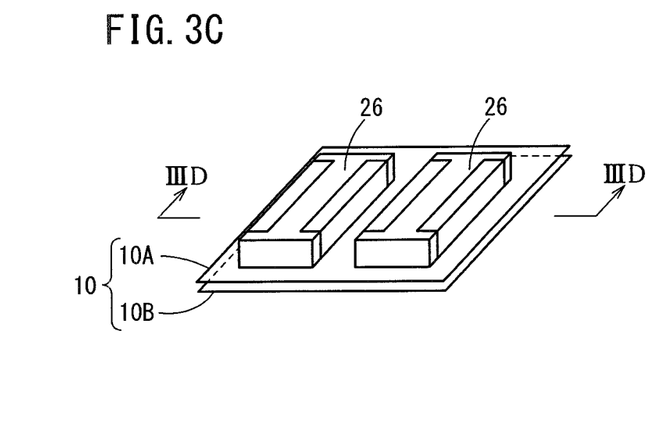
FIG. 3C is a perspective view illustrating a situation where a plurality of chip components have been produced by at least surface-treating exposed side surface portions of the plurality of chip pieces.
Figure 3D:
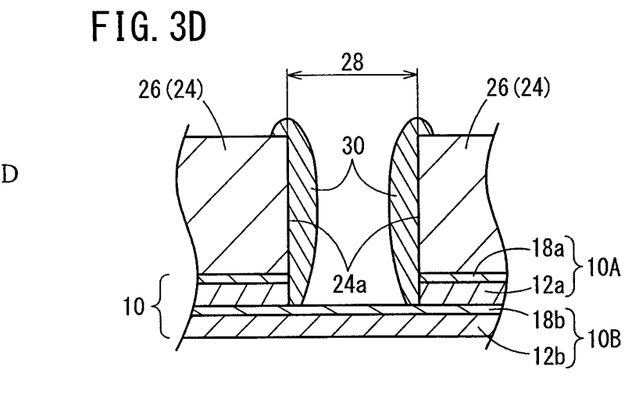
FIG. 3D is the cross section taken along line IIID-IIID in FIG. 3C.

Next, in the process 4 (side surface treatment process), in step S5 of FIG. 1, as shown in FIGS. 3C and 3D, side surface portions 24*a* of the plurality of chip pieces 24 that have been exposed by the removal above are subjected to at least a surface treatment in order to produce a plurality of chip components 26 (see FIG. 3D). Removing the dummy portion 22 in step S3 forms a gap 28 (space) between the plurality of chip pieces 24.

Accordingly, the exposed side surface portions 24*a* of the multiple chip pieces 24 can be subjected to a surface treatment such as application of paste, with the multiple chip pieces 24 being stuck on the carrier sheet 10, whereby electrode films 30 (side surface electrodes etc.), for example, are formed on the side surface portions 24*a* of the multiple chip pieces 24. Needless to say, not only surface treatment but also various processes (formation of trenches etc.) can be applied to the side surface portions 24*a* of the multiple chip pieces 24.

Next, in the process 5 (chip component removal process), in step S6 of FIG. 1, the chip components 26 are removed from the carrier sheet 10. That is, the chip components 26 are peeled off the second sheet 10B.

In this way, in the first manufacturing method, in the process 3, at least the dummy portion 22 of the green sheet 14 or green laminate 16 after having been cut, is removed together with part of the carrier sheet 10, leaving multiple chip pieces 24 on the carrier sheet 10. Consequently, the multiple chip pieces 24 can be handled and easily put into the next process (side surface treatment process), with the multiple chip pieces 24 being stuck on the carrier sheet 10. Furthermore, at least surface treatment can be performed with the multiple chip pieces 24 being stuck on the carrier sheet 10.

As to the carrier sheet 10, carrier sheets 10 structured as shown below may be adopted.

Figure 4:
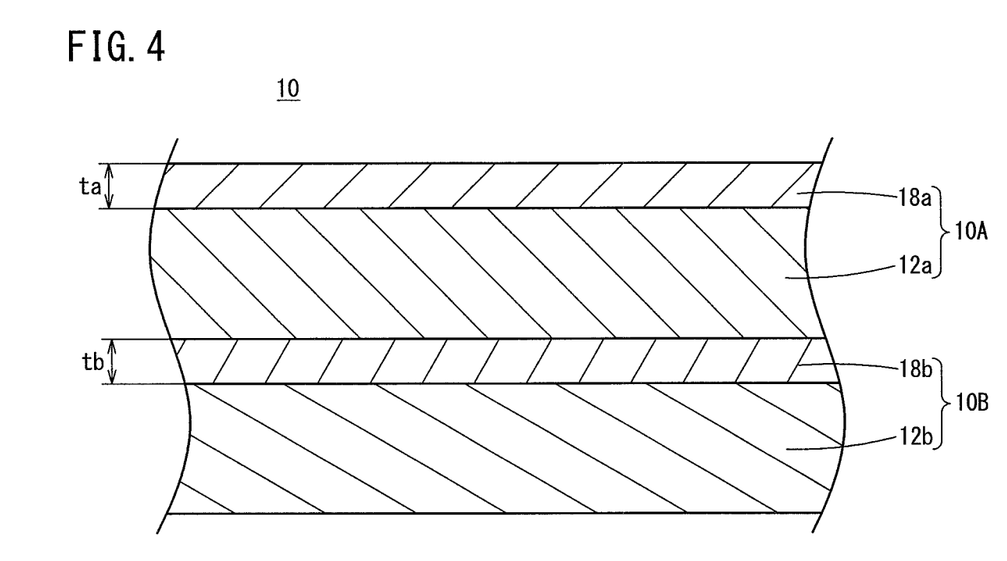
FIG. 4 is a cross section illustrating the carrier sheet.

It is preferred that the first adhesive layer 18*a* of the first sheet 10A has a lower adhesive strength than the second adhesive layer 18*b* of the second sheet 10B. Also, as shown in FIG. 4, it is preferred that the second adhesive layer 18*b* has a thickness tb as thin or small as a thickness to of the first adhesive layer 18*a*.

If the first adhesive layer 18*a* has a high adhesive strength, the surface-treated portions (electrodes etc.) may partially come off in the removal of the chip components 26 from the carrier sheet 10. On the other hand, if the first adhesive layer 18*a* has too low an adhesive strength, the position of the chip pieces 24 may be displaced during the cutting in the process 2 (cutting process) and then they may be peeled off together with the dummy portion 22 in the third, dummy portion removal process.

Further, lowering the adhesive strength of the second adhesive layer 18*b* may cause positional shift of the chip pieces 24 in the cutting process and make it difficult to align (arrange) the chip pieces 24. This may hinder surface treatment etc. where multiple chip pieces 24 are processed at once.

On the other hand, enlarging the thickness tb of the second adhesive layer 18*b* may lead to a large amount of displacement of the second adhesive layer 18*b* in the shearing direction during the cutting process, which, too, may lead to positional shift of the chip pieces 24 and make it difficult to align the chip pieces 24.

Positional shift of the chip pieces 24 can be suppressed when the adhesive strength of the second adhesive layer 18*b* is higher than the adhesive strength of the first adhesive layer 18*a* and the thickness tb of the second adhesive layer 18*b* is thinner. Furthermore, this prevents the chip pieces 24 from coming off together with the remaining part of the first sheet 10A when the carrier sheet 10 with the chip pieces held thereon is handled to be put into the next process.

It is preferred that the first adhesive layer 18*a* of the first sheet 10A and the second adhesive layer 18*b* of the second sheet 10B are adhesive layers whose adhesive strengths vary with temperature change or ultraviolet irradiation. For example, the first sheet 10A can be a temperature-sensitive adhesive sheet whose adhesive strength lowers when the temperature of the first adhesive layer 18*a* has reached a predetermined switching temperature or lower. Further, for example, the first sheet 10A can be an ultraviolet-curable adhesive tape in which the adhesive strength of the first adhesive layer 18*a* lowers with ultraviolet irradiation. The same applies also to the second sheet 10B.

In this way, when temperature-sensitive adhesive sheets are used as the first sheet 10A and second sheet 10B, the temperature of the first adhesive layer 18*a* of the first sheet 10A and the second adhesive layer 18*b* of the second sheet 10B is set higher than the switching temperature in the process 1 and process 2. Then, in the process 3, the temperature of the second adhesive layer 18*b* is set lower than the switching temperature so that the dummy portion 22 can be easily removed together with the underlying part of the cut first sheet 10A.

In the process (handling) of bringing into the process 4 and in the process 4 (surface treatment etc.), the operations may be carried out while maintaining the temperature of the second adhesive layer 18*b* at the temperature in the process 3, for example. It is possible to shorten the processing time.

Needless to say, in and after the process of bringing into the process 4 (in and after the step S4), the temperature of the first adhesive layer 18*a* of the first sheet 10A and the second adhesive layer 18*b* of the second sheet 10B may be set higher than the switching temperature again. This heightens the adhesive strength of the first adhesive layer 18*a* and the second adhesive layer 18*b* and facilitates handling of the multiple chip pieces 24 in the state stuck on the carrier sheet 10. This also prevents the chip pieces 24 from coming off the carrier sheet 10 during the surface treatment etc. in the process 4.

In the following process 5, the temperature of the first adhesive layer 18*a* of the first sheet 10A and the second adhesive layer 18*b* of the second sheet 10B is set lower than the switching temperature and the chip components 26 are removed.

In cases where the temperature of the first adhesive layer 18*a* of the first sheet 10A and the second adhesive layer 18*b* of the second sheet 10B is set lower than the switching temperature in the process 5, then the adhesive strength of the first adhesive layer 18a lowers and so the chip components 26 can be removed easily. However, rapid temperature variation may cause problems such as detachment of the electrodes etc. formed on the side surface portions of the chip components 26. Accordingly, it is preferred that, after the surface treatment etc., the temperature of the first adhesive layer 18a and the second adhesive layer 18b is not lowered below the switching temperature. It is hence preferred that the adhesive strength of the first adhesive layer 18a be lower than the adhesive strength of the second adhesive layer 18b. This prevents electrodes etc., formed on the side surface portions of the chip components 26, from coming off during the removal of the chip components 26 from the carrier sheet 10, thereby improving yield of the chip components 26.

Next, a method for manufacturing chip components according to a second embodiment (hereinafter referred to as a second manufacturing method) will be described referring to FIGS. 5 and 6A to 6C.

The second manufacturing method includes similar processes to the above-described first manufacturing method, but differs from the first manufacturing method in that it includes processes of applying surface treatment etc. multiple times to the side surface portions 24a of the chip pieces 24.

Figure 5:
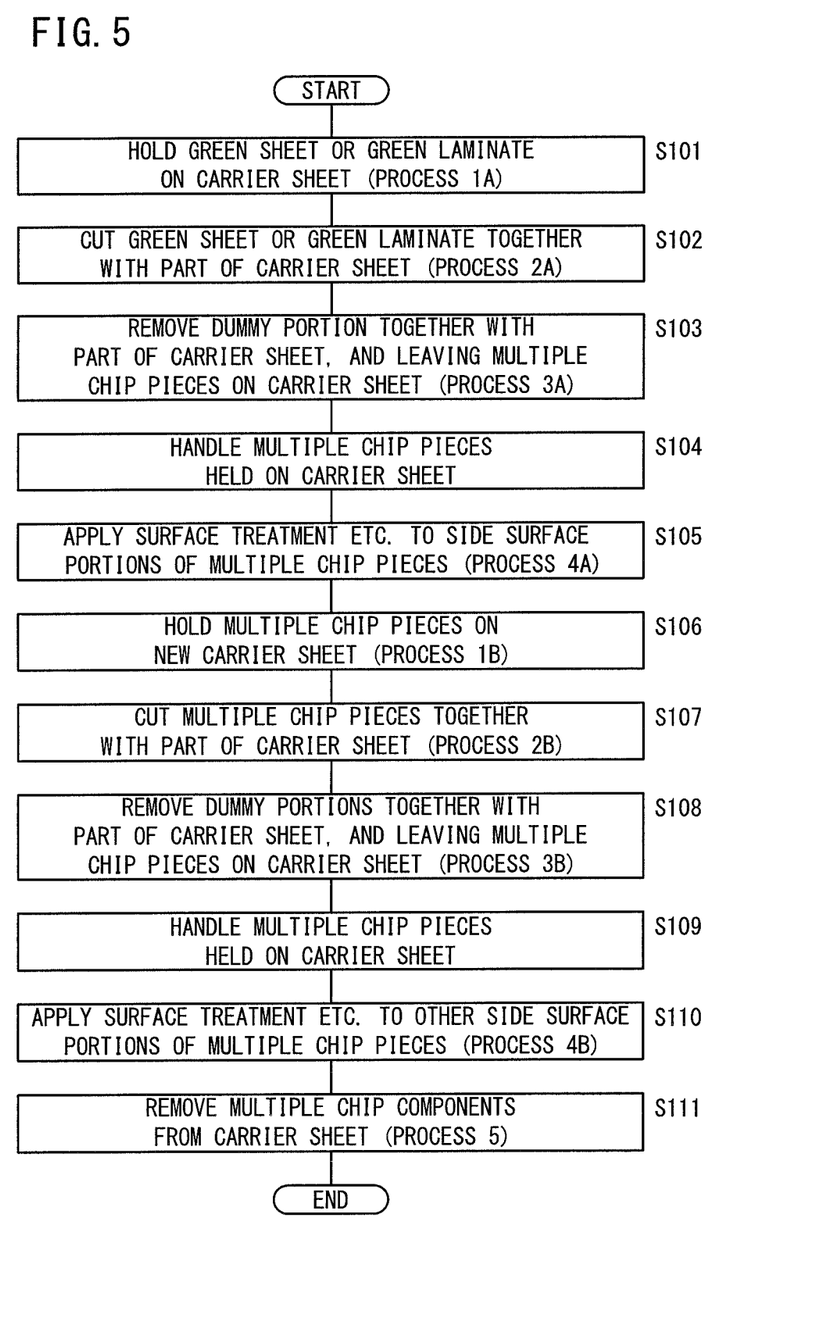
FIG. 5 is a flowchart showing a chip component manufacturing method according to a second embodiment (a second manufacturing method)
Figure 6A:
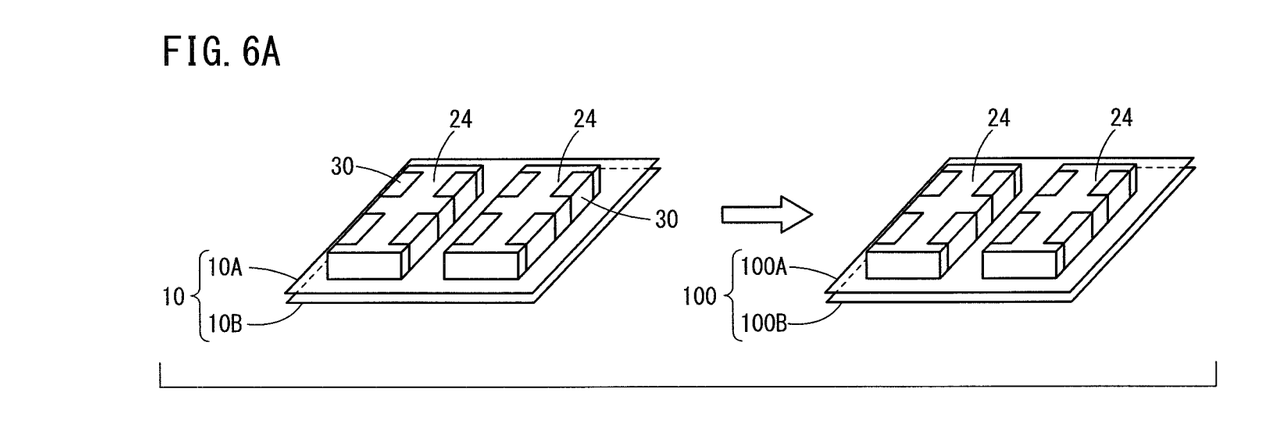
FIG. 6A is a perspective view illustrating a situation where, in the second manufacturing method, a plurality of chip pieces having electrode films formed on their side surface portions are removed from the carrier sheet and re-stuck on a top surface of a new carrier sheet.

Specifically, first, processes 1A (step S101) to 4A (step S105) of FIG. 5 are performed, so as to, as shown in FIG. 6A, form electrode films 30 by surface treatment etc. to first side surface portions of the chip pieces 24.

Subsequently, in the process 1B of FIG. 5 (step S106: re-sticking process), as shown in FIG. 6A, the plurality of chip pieces 24 are held on a new carrier sheet 100. That is, the plurality of chip pieces 24 are moved to the new carrier sheet 100. For example, with the plurality of chip pieces 24 being placed on the original carrier sheet 10, a thermally foamable sheet (not shown) is stuck on the plurality of chip pieces 24. After that, the workpiece, where the plurality of chip pieces 24 are sandwiched between the original carrier sheet 10 and the thermally foamable sheet, is set to the switching temperature or lower and the original carrier sheet 10 is peeled off.

Subsequently, the plurality of chip pieces 24 are moved from the thermally foamable sheet to the new carrier sheet 100, utilizing temperature difference on high-temperature side. That is, with the plurality of chip pieces 24 placed on the thermally foamable sheet, the new carrier sheet 100 is stuck on the plurality of chip pieces 24. Subsequently, the workpiece, where the plurality of chip pieces 24 are sandwiched between the new carrier sheet 100 and the thermally foamable sheet, is set to high temperature (at or above a release starting point of the thermally foamable sheet) and the thermally foamable sheet is peeled off. The plurality of chip pieces 24 have thus been re-stuck on the new carrier sheet 100. It is thus possible to move the plurality of chip pieces 24, which are stuck on the original carrier sheet 10 in alignment, to the new carrier sheet 100 while maintaining the alignment.

Figure 6B:
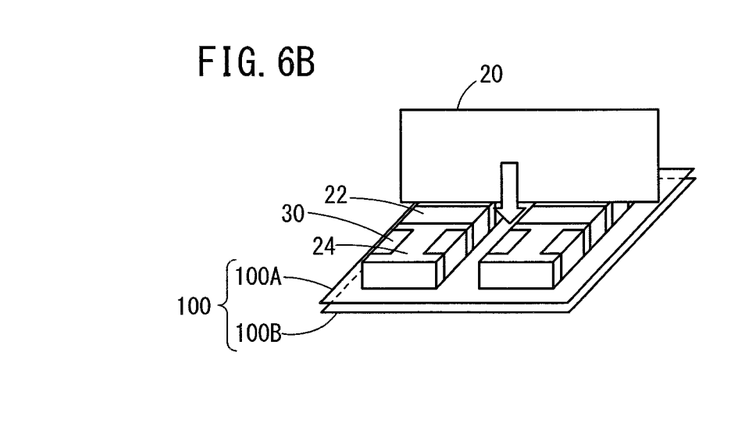
FIG. 6B is a perspective view illustrating a situation where the chip pieces held on the new carrier sheet are cut together with part of the new carrier sheet.

Next, in the process 2B of FIG. 5 (step S107: cutting process), as shown in FIG. 6B, the plurality of chip pieces 24 held on the new carrier sheet 100 are cut together with part of the carrier sheet 100.

Figure 6C:
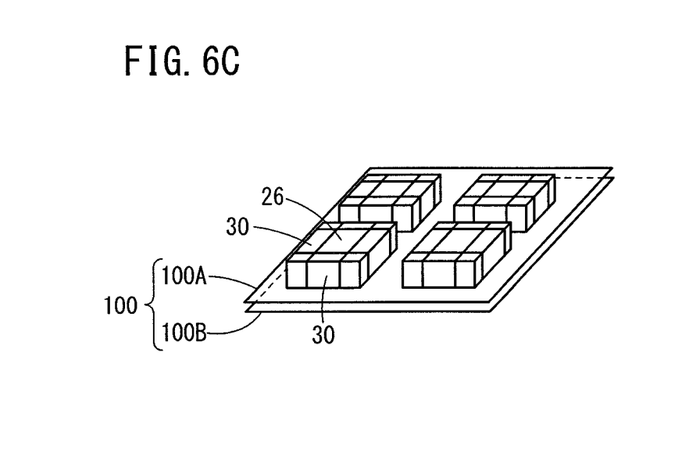
FIG. 6C is a perspective view illustrating a situation where a plurality of chip components have been produced by at least surface-treating the exposed, other side surface portions of the plurality of chip pieces.

Next, in the process 3B of FIG. 5 (step S108: dummy portion removal process), as shown in FIG. 6C, the dummy portions 22 (see FIG. 6B) formed by the cutting process are removed together with parts of the carrier sheet 100, leaving a plurality of chip pieces 24 on the carrier sheet 100. At this time, parts of the cut first sheet 100A underlying the dummy portions 22 are also peeled off together with the dummy portions 22.

Subsequently, in step S109, the plurality of chip pieces 24 are handled while being held on the carrier sheet 100 and put into the next process (side surface treatment process).

Next, in the process 4B of FIG. 5 (step S110: side surface treatment process), as shown in FIG. 6C, at least a surface treatment (formation of electrode films 30) is applied to other side surface portions of the plurality of chip pieces 24 (see FIG. 6B) that have been exposed by the removal of the dummy portions 22 explained above, so as to produce a plurality of chip components 26.

Next, in the process 5 of FIG. 5 (step S111: chip component removal process), the chip components 26 (chip pieces where the electrode films 30 have been formed on the first side surface portions and the other side surface portions) are removed from the carrier sheet 100.

In this way, by repeating the series of processes 1 to 4, it is possible to produce a large number of complicatedly configured chip pieces 24 and to form the electrode films 30 on a plurality of side surfaces of each chip piece 24.

EXAMPLES

Examples 1 to 6 and a comparative example were examined to see the percent defectives of chip components, using carrier sheets 10 having adhesive layers with varying adhesive strengths and thicknesses.

Example 1

In example 1, a two-layered sheet having a first sheet 10A and a second sheet 10B was used as the carrier sheet 10. A cool-off type temperature-sensitive adhesive sheet (made by Nitta Corporation: CS5010C25) was used as the first sheet 10A and a temperature-sensitive adhesive sheet (Nitta Corporation: CS5040008) of cool-off type, too, was used as the second sheet 10B.

More specifically, the first sheet 10A included a first adhesive layer 18a having an adhesive strength of 0.1 N/25 mm and a thickness of 10 μm. The second sheet 10B included a second adhesive layer 18b having an adhesive strength of 0.4 N/25 mm and a thickness of 40 μm.

A plurality of chip components 26 were manufactured through the manufacturing processes shown in FIG. 1. In this case, in the process 2 (cutting process), the green sheet 14 or green laminate 16 was heated to 80° C. and cut. In this process 2, cuts were made along 124 lines in the length direction and 53 lines in the width direction.

In the process 3 (dummy portion removal process), the dummy portions 22 were removed together with parts of the carrier sheet 10 (parts of the first sheet 10A after having been cut) using an equal-pitch comb-teeth-like jig. In the process 4 (side surface treatment process), side surface electrodes 30 were formed by screen printing on the side surface portions 24a of each chip piece 24. Then, in the process 5 (chip component removal process), the chip components 26 left on the carrier sheet 10 were removed.

Example 2

In example 2, a plurality of chip components 26 were manufactured in the same manner as the above-described example 1 except that a cool-off type temperature-sensitive adhesive sheet (made by Nitta Corporation: CS5010005) was used as the second sheet 10B of the carrier sheet 10. The second sheet 10B included a second adhesive layer 18b having an adhesive strength of 1.2 N/25 mm and a thickness of 40 μm.

Example 3

In example 3, a plurality of chip components 26 were manufactured in the same manner as the above-described example 1 except that a cool-off type temperature-sensitive adhesive sheet (made by Nitta Corporation: CS5010C02) was used as the second sheet 10B of the carrier sheet 10. The second sheet 10B included a second adhesive layer 18b having an adhesive strength of 5.9 N/25 mm and a thickness of 40 μm.

Example 4

In example 4, a plurality of chip components 26 were manufactured in the same manner as the above-described example 3 except that the thickness tb of the second adhesive layer 18b of the carrier sheet 10 was adjusted to 30 μm.

Example 5

In example 5, a plurality of chip components 26 were manufactured in the same manner as the above-described example 3 except that the thickness tb of the second adhesive layer 18b of the carrier sheet 10 was adjusted to 20 μm.

Example 6

In example 6, a plurality of chip components 26 were manufactured in the same manner as the above-described example 3 except that the thickness tb of the second adhesive layer 18b of the carrier sheet 10 was adjusted to 10 μm.

Example 7

In example 7, a plurality of chip components 26 were manufactured in the same manner as the above-described example 3 except that a cool-off type temperature-sensitive adhesive sheet (made by Nitta Corporation: CS5010080) was used as the first sheet 10A of the carrier sheet 10. The first sheet 10A included a first adhesive layer 18a having an adhesive strength of 0.05 N/25 mm and a thickness of 10 μm.

Comparative Example

In the comparative example, a single-layered sheet only having a first sheet 10A was used as the carrier sheet 10. A cool-off type temperature-sensitive adhesive sheet (made by Nitta Corporation: CS5010C25) was used as the first sheet 10A. More specifically, the first sheet 10A included a first adhesive layer 18a having an adhesive strength of 0.1 N/25 mm and a thickness of 10 μm.

In the comparative example, though not shown graphically, the ceramic green sheet 14 or green laminate 16 was held on the carrier sheet 10 (only the first sheet 10A). After that, the green sheet 14 or green laminate 16 held on the carrier sheet 10 was cut together with parts of the carrier sheet 10. A plurality of chip pieces 24 are thus held on the carrier sheet 10.

Subsequently, the plurality of chip pieces 24 being held on the carrier sheet 10 were handled and put into the next process. Then, the plurality of chip pieces 24 were removed from the carrier sheet 10. Next, the plurality of chip pieces 24 were aligned (arranged) for the next process (surface treatment etc.). Then, side surface electrodes 30 were formed by screen printing on side surface portions 24a of each chip piece 24.

[Percent Defective]

The percent defective was obtained by calculating A/M, where M denotes the number of chip components 26 that were planned to be manufactured from the green sheet 14 or green laminate 16 stuck on one carrier sheet 10, and A denotes the number of chip components 26 that were manufactured actually.

[Results of Evaluation]

Figure 7:
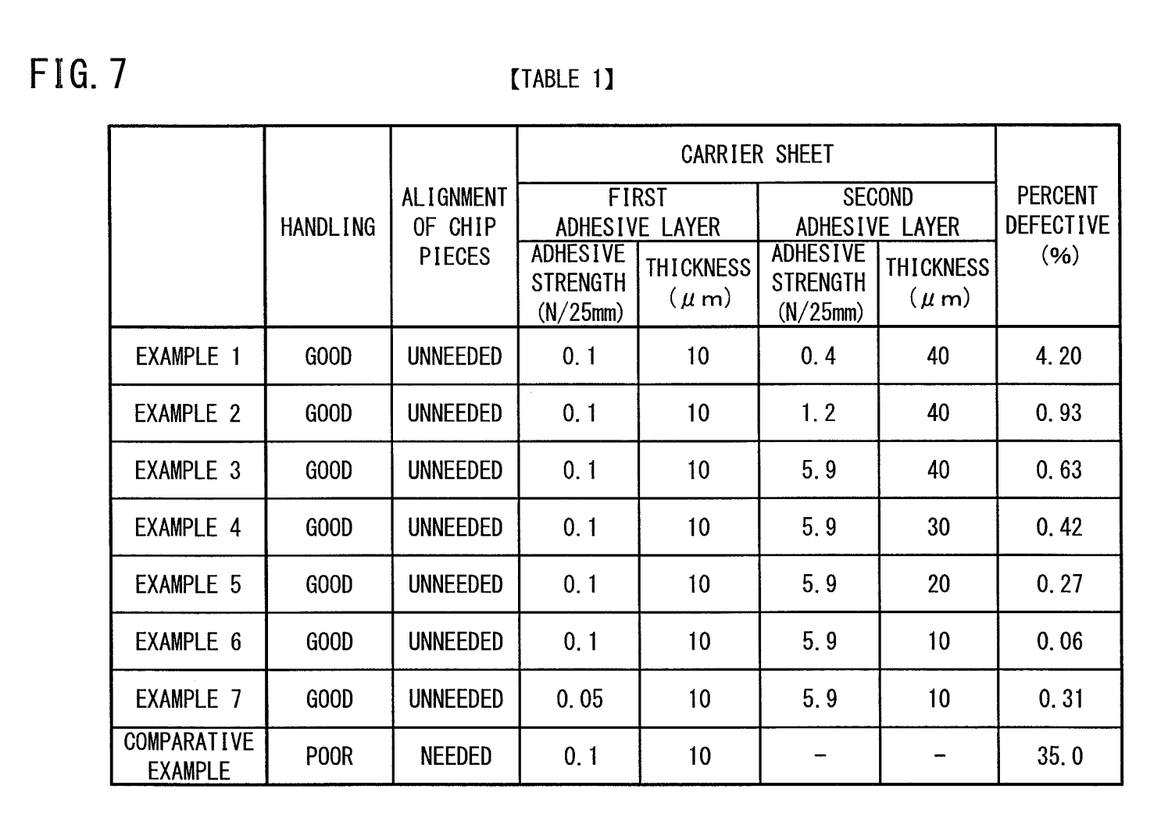
FIG. 7 is table 1 showing evaluation of examples 1 to 7 and a comparative example.

Table 1 of FIG. 7 shows the results of evaluation. The results in Table 1 show that the state of handling was poor in the comparative example. That is, chip pieces 24 came off the carrier sheet 10 during handling, resulting in an increased percent defective. This means that, since the carrier sheet 10 is composed only of the first sheet 10A, cuts were made into the first base layer 12a of the first sheet 10A (carrier sheet) in the cutting process. Accordingly, it is conceivable that the reason is that, during handling, the first sheet 10A bent at the cuts in the first base layer 12a and it became difficult to stably hold the carrier sheet 10. Further, in the comparative example, it was necessary to align the plurality of chip pieces 24 in the stage prior to the surface treatment etc. of the chip pieces 24. It is conceivable that the percent defective increased also because chip pieces 24 were lost in the alignment work.

In contrast, the examples 1 to 7 showed excellent results with percent defectives of less than 5%. It is thought that the percentage defectives noticeably decreased because the adoption of the two-layered structure as the carrier sheet 10 enabled the handling work to be performed in a suitable manner, enabled the surface treatment etc. to be carried out with the plurality of chip pieces 24 being stuck on the carrier sheet 10, and eliminated the need for the work of aligning the chip pieces 24.

The examples 2 to 7, except example 1, showed percent defectives of less than 1%. It is thought that, in the example 1, because the adhesive strength of the second adhesive layer 18b of the second sheet 10B was as small as 0.4 N/25 mm, the position of the chip pieces 24 gradually shifted together with the first adhesive layer 18a when cuts of 124 lines in the length direction, for example, were made in the cutting process. It is thought that this led to the percentage defective.

Examining in detail the results of the examples 2 to 7, where the percent defectives were less than 1%, shows that the percent defective decreases as the adhesive strength of the second adhesive layer 18b of the second sheet 10B becomes larger in the examples 2 to 6 except in the example 7. It is thought that the percent defective decreased because positional shift of the chip pieces 24 and the first adhesive layer 18a was less likely to occur in the cutting process as the adhesive strength of the second adhesive layer 18b became larger.

Further, the percent defective decreased as the thickness tb of the second adhesive layer 18b of the second sheet 10B became smaller. It is thought that the percent defective deceased because the amount of shift of the second adhesive layer 18b in the shearing direction during the cutting process became smaller as the thickness tb of the second adhesive layer 18b became smaller.

In the example 7 where the adhesive strength of the first adhesive layer 18a was as small as 0.05 N/25 mm, it is conceivable that the percent defective was affected because the chip pieces 24 were prone to positional shift in the cutting process and peeled off together with the dummy portions 22 in the dummy portion removal process of process 3.

The chip component manufacturing method of the present invention is not limited to the above-described embodiments and various configurations are of course possible without departing from the essence and gist of the present invention.

The invention claimed is:

1. A chip component manufacturing method, comprising the steps of:
    holding a ceramic green sheet or green laminate on a first carrier sheet;
    cutting the green sheet or green laminate held on the first carrier sheet together with part of the first carrier sheet;
    removing part of the green sheet or green laminate, after having been cut, that is not used as at least a product, together with part of the first carrier sheet, and leaving a plurality of chip pieces on the first carrier sheet; and
    with the plurality of chip pieces being held on the first carrier sheet, applying at least a surface treatment to side surface portions of the plurality of chip pieces that have been exposed by removing the part of the green sheet or green laminate that is not used as at least the product;
    wherein the surface treatment includes applying a paste to form at least one electrode film.

2. The chip component manufacturing method according to claim 1, further comprising the steps of:
    holding the plurality of chip pieces on a second carrier sheet and then removing the plurality of chip pieces from the first carrier sheet on which the plurality of chip pieces were held originally;
    cutting the chip pieces held on the second carrier sheet together with part of the second carrier sheet;
    removing parts of the chip pieces, after having been cut, that are not used as at least products, together with part of the second carrier sheet, and leaving a plurality of chip pieces on the second carrier sheet; and
    with the plurality of chip pieces being held on the second carrier sheet, applying at least a surface treatment to other side surface portions of the plurality of chip pieces that have been exposed by removing the parts of the chip pieces that are not used as at least products.

3. The chip component manufacturing method according to claim 1, wherein the first carrier sheet has a laminated structure including two or more sheets, each sheet including a base layer and an adhesive layer formed on one surface of the base layer.

4. The chip component manufacturing method according to claim 3, wherein the adhesive layer of at least one of the two or more sheets of the laminated structure of the first carrier sheet has an adhesive strength that decreases with exposure to a change in temperature or exposure to ultraviolet irradiation.

5. The chip component manufacturing method according to claim 3, wherein each of the adhesive layers of the two or more sheets of the laminated structure has an adhesive strength that is set arbitrarily, and the adhesive strength of each of the adhesive layers of the two or more sheets of the laminated structure of the first carrier sheet is the same or different.

6. The chip component manufacturing method according to claim 3, wherein
    the first carrier sheet includes a laminate of a first sheet and a second sheet,
    the first sheet includes a first base layer and a first adhesive layer on which the green sheet or green laminate is held, and
    the second sheet includes a second base layer and a second adhesive layer on which the first sheet is held.

7. The chip component manufacturing method according to claim 6, wherein the first adhesive layer has a lower adhesive strength than the second adhesive layer.

8. The chip component manufacturing method according to claim 7, wherein the second adhesive layer has an adhesive strength that is equal to or greater than four times the adhesive strength of the first adhesive layer.

9. The chip component manufacturing method according to claim 6, wherein the first adhesive layer has a thickness which is smaller than that of the second adhesive layer.

10. The chip component manufacturing method according to claim 6, wherein the first adhesive layer has an adhesive strength equal to or greater than 0.05 N/25 mm and a thickness equal to or less than 10 μm.

11. The chip component manufacturing method according to claim 6, wherein the second adhesive layer has an adhesive strength equal to or greater than 0.4 N/25 mm and a thickness equal to or less than 40 μm.

* * * * *